US012800617B2

(12) United States Patent
Chou et al.

(10) Patent No.: US 12,800,617 B2
(45) Date of Patent: Nov. 17, 2026

(54) NON-CONTACT ALTERNATING CURRENT SENSING PROBE AND SENSING METHOD AND APPLICATION THEREOF

(71) Applicants: MEET ELECTRONICS LTD., Dongguan (CN); Ronald Chi Kang Chou, Dongguan (CN)

(72) Inventors: Ronald Chi Kang Chou, Dongguan (CN); Kai Sheng Chou, Dongguan (CN)

(73) Assignees: RONALD CHOU, Dongguan (CN); MEET ELECTRONICS LTD., Dongguan (CN)

( * ) Notice: Subject to any disclaimer, the term of this patent is extended or adjusted under 35 U.S.C. 154(b) by 217 days.

(21) Appl. No.: 18/776,434

(22) Filed: Jul. 18, 2024

(65) Prior Publication Data

US 2025/0044323 A1 Feb. 6, 2025

(30) Foreign Application Priority Data

Aug. 4, 2023 (CN) ......................... 202310981507.9

(51) Int. Cl.
*G01R 15/18* (2006.01)

(52) U.S. Cl.
CPC .................................. *G01R 15/181* (2013.01)

(58) Field of Classification Search
CPC ........ G01R 15/181; G01R 1/04; G01R 1/067; G01R 1/18; G01R 15/12; G01R 15/148; G01R 15/183

(Continued)

(56) References Cited

U.S. PATENT DOCUMENTS 5,075,629 A * 12/1991 Umemura .............. G01R 31/12
340/646
5,652,521 A * 7/1997 Meyer .................... G01R 15/16
324/541

(Continued)

FOREIGN PATENT DOCUMENTS

WO WO-9963352 A1 * 12/1999 ............ G01R 31/12

OTHER PUBLICATIONS

Tiwari, Yogendra S., et al. "A Study on Induced Voltages in Control Cables and their Mitigation." Power Research—A Journal of CPRI (2024): 143-147. (Year: 2024).*

*Primary Examiner* — Christopher P McAndrew
(74) *Attorney, Agent, or Firm* — The Sun IP Law

(57) ABSTRACT

The present invention discloses a non-contact alternating current sensing probe and a sensing method and application thereof. Alternating current measurement can be directly performed on a single wire or a cable composed of two or more wires. During detection, the detection port is adjusted to a better measurement position of a target wire through position adjustment, so that an electromagnetic signal generated by the target wire passes through the detection port and enters the shielding space to be collected by the induction coil, sensing of alternating current-related electrical parameters, including a current, a voltage, a frequency, a duty cycle, a phase, a harmonic, a frequency-conversion signal, etc. is realized, and the probe can work for a long time, cannot lead to the problem of inaccuracy caused by heat, can be applied to measuring instruments such as a test pen, a multimeter and a clamp meter, and has large application prospects.

10 Claims, 29 Drawing Sheets

(58) Field of Classification Search
USPC .......................................................... 324/126
See application file for complete search history.

(56) References Cited

U.S. PATENT DOCUMENTS

| | | | | |
|---|---|---|---|---|
| 9,030,197 | B1 * | 5/2015 | Meske | G01R 15/185 324/225 |
| 10,468,158 | B2 * | 11/2019 | Maples | G01V 1/201 |
| 2002/0125877 | A1 * | 9/2002 | Cooke | G01R 15/18 324/127 |
| 2015/0325336 | A1 * | 11/2015 | Maples | D07B 1/24 174/126.1 |

* cited by examiner

NON-CONTACT ALTERNATING CURRENT SENSING PROBE AND SENSING METHOD AND APPLICATION THEREOF

CROSS-REFERENCE TO RELATED APPLICATIONS

This application claims priority to Chinese Patent Application No. 202310981507.9, filed on Aug. 4, 2023, which is hereby incorporated by reference in its entirety.

TECHNICAL FIELD

The present invention relates to the technical field of measuring instruments, in particular to a non-contact alternating current sensing probe and a sensing method and an application thereof.

BACKGROUND

In order to protect electricity safety, wires which are possibly exposed are protected with an insulating adhesive layer or a plastic shell; in this case, when conventional contact measurement is adopted, the contact measurement is performed after the insulation layer is broken, or the measurement is performed by contacting the interior of a power line after the insulation layer is punctured, and whether the measurement by breakage or the measurement by puncture is used, the insulation layer of a protected power system will be damaged, causing potential electricity safety hazard.

For this reason, non-contact measuring instruments are commercially available, which can measure an alternating current without damaging a protective insulation layer of a wire. However, most of the existing non-contact alternating current measuring and induction instruments on the market use conventional probes with thick silicon steel sheets in a closed loop or semi-open mode, which can realize the purpose of alternating current measurement on wires, but can only perform alternating current measurement on a single wire, and when a cable (except a shielded cable) is composed of two or more wires, alternating current measurement cannot be directly performed, because when a clamp meter clamps two wires (such as a live wire and a zero wire) at the same time, magnetic fields generated by the two wires are counteracted in opposite directions, that is, a resultant magnetic field is zero, and a reading number of the clamp meter is zero, which cannot reflect the real current of the circuit. To this end, it is necessary to peel off an insulation protective layer of the cable and measure each wire separately, which is not only cumbersome to operate and inefficient in measurement, but also similarly intended to a problem of damaging the insulation protective layer, affecting use safety.

SUMMARY

In view of the foregoing shortcomings, the purpose of the present invention is to provide a non-contact alternating current sensing probe that is simple to operate and can directly perform alternating current measurement on an unshielded cable, and a sensing method thereof.

In order to achieve the foregoing purpose, the present invention provides the following technical solutions:

A non-contact alternating current sensing method comprises the following steps:

constructing a sealed shielding space for preventing electromagnetic interference, arranging a detection port that can allow an electromagnetic signal in a specific direction to enter the shielding space, and arranging, in the shielding space, an induction coil that can collect the electromagnetic signal passing through the detection port to enter the shielding space;

during sensing of a single wire, enabling the detection port to be close to but not in contact with the single wire, so that an electromagnetic signal generated when an alternating current flows in the single wire can be allowed to pass through the detection port to enter the shielding space to be collected by the induction coil, and the induction coil outputs a corresponding current signal;

during sensing of a non-twisted cable formed by two or more wires arranged in parallel, enabling the detection port to be close to but not in contact with the non-twisted cable, and rotating around the non-twisted cable, so that the detection port faces the wires in the non-twisted cable one by one, and an electromagnetic signal generated when an alternating current flows in a target wire in the non-twisted cable can be allowed to pass through the detection port to enter the shielding space to be collected by the induction coil, and the induction coil outputs a corresponding current signal; and during sensing of a twisted cable formed by two or more wires twisted together, enabling the detection port to be close to but not in contact with the twisted cable, and then rotating around the twisted cable and/or moving along a direction of a central axis of the twisted cable, so that an electromagnetic signal generated when an alternating current flows in a target wire in the twisted cable can be allowed to pass through the detection port to enter the shielding space to be collected by the induction coil, and the induction coil outputs a corresponding current signal.

Subsequently, the current signal output by the induction coil is subjected to signal amplification and noise filtering and then is subjected to analytic operation processing by a main control MCU chip, related electrical parameters are obtained, and the electrical parameters comprise a current, a voltage, a frequency, a duty cycle, a phase, a harmonic, and a frequency-conversion signal.

A non-contact alternating current sensing probe for implementing the non-contact alternating current sensing method comprises a metal shielding shell and an induction coil, wherein the metal shielding shell is used for constructing a sealed shielding space for preventing electromagnetic interference; the metal shielding shell is provided with a detection port that can allow an electromagnetic signal in a specific direction to enter the shielding space; and the induction coil is located in the metal shielding shell, and is used for sensing the electromagnetic signal that enters the metal shielding shell from the detection port and outputting a corresponding current signal.

As a preferred solution of the present invention, the induction coil is a hollow induction coil, with an iron rod for enhancing sensitivity of the induction coil to a magnetic field change penetrating through the middle, and the iron rod can enhance the sensitivity of the induction coil to the magnetic field change, so that detection effect is improved, making it more sensitive and accurate.

As a preferred solution of the present invention, the induction coil is connected to a signal amplification circuit, the signal amplification circuit amplifies the current signal induced by the induction coil, and an amplified current signal is input to a main control MCU chip for analytic operation processing.

As a preferred solution of the present invention, the iron rod is connected to another signal amplification circuit, so that precision and reliability of detection can be improved, and the probe can adapt to more complex application scenarios.

As a preferred solution of the present invention, the metal shielding shell is connected to a noise filter circuit, so that unnecessary noise can be filtered.

The non-contact alternating current sensing probe is applied to a test pen, the induction coil is a hollow induction coil, and a feeler pin of the test pen penetrates through the induction coil, thereby realizing multi-function detection, and the test pen is small in size and has a wide range of applications.

The non-contact alternating current sensing probe is applied to a measuring instrument, such as a multimeter, a clamp meter, and other measuring instruments of different shapes and types.

The present invention has the following beneficial effects: the non-contact alternating current sensing probe of the present invention is ingenious and reasonable in structural design, alternating current measurement can be directly performed on a single wire or a cable composed of two or more wires (except a shielded cable), and during detection, the detection port is adjusted to a better measurement position of a target wire through rotation and/or movement, so that an electromagnetic signal generated by the target wire passes through the detection port and enters the shielding space to be collected by the induction coil, and electromagnetic signals generated by other non-target wires are shielded by the metal shielding shell, thereby avoiding interference, realizing sensing of alternating current-related electrical parameters, including a current, a voltage, a frequency, a duty cycle, a phase, a harmonic, a frequency-conversion signal, etc., realizing sensing without peeling and branching the cable, ensuring use safety, and being simple and convenient to operate; and in addition, an overall structure is simple and small in size, a traditional silicon steel sheet structure is omitted, so that the non-contact alternating current sensing probe can work for a long time, cannot lead to the problem of inaccuracy caused by heat, has high measurement accuracy, can be applied to measuring instruments such as a test pen, a multimeter, and a clamp meter, and has a large application prospect.

The present invention will be further explained below with reference to drawings and embodiments.

DETAILED DESCRIPTION OF THE EMBODIMENTS

Figure 1:
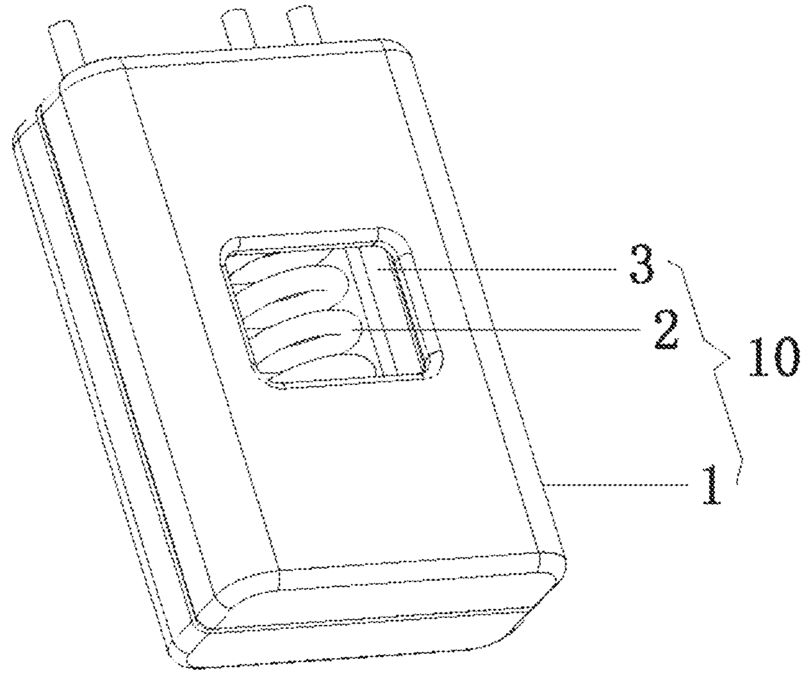
FIG. 1 is a three-dimensional structural schematic diagram of a non-contact alternating current sensing probe in Embodiment 1 of the present invention.
Figure 2:
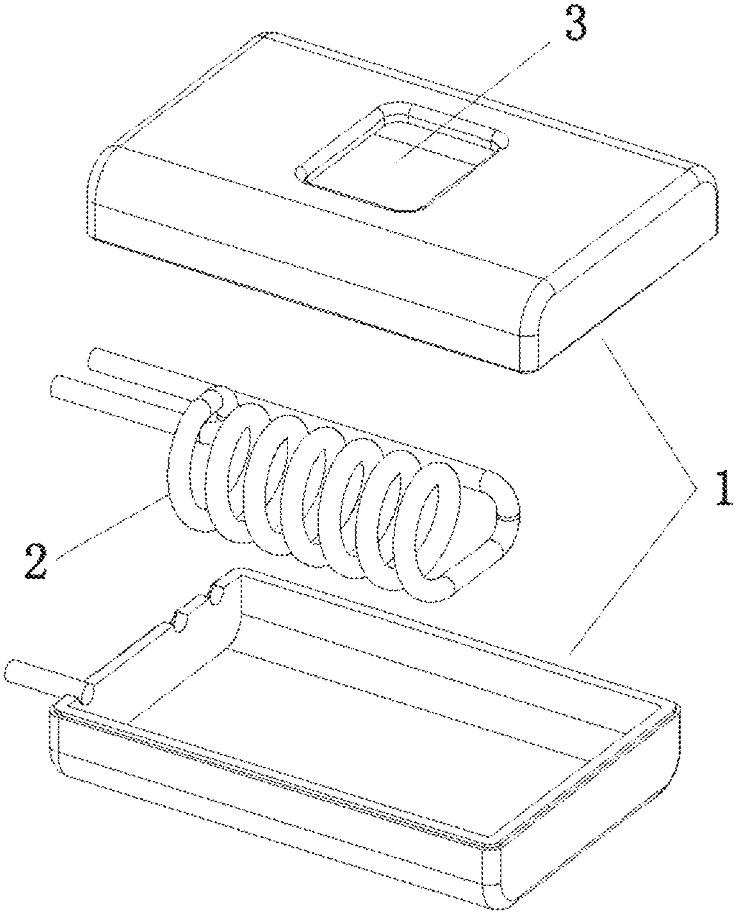
FIG. 2 is an exploded structural schematic diagram of the non-contact alternating current sensing probe in Embodiment 1 of the present invention.
Figure 3:
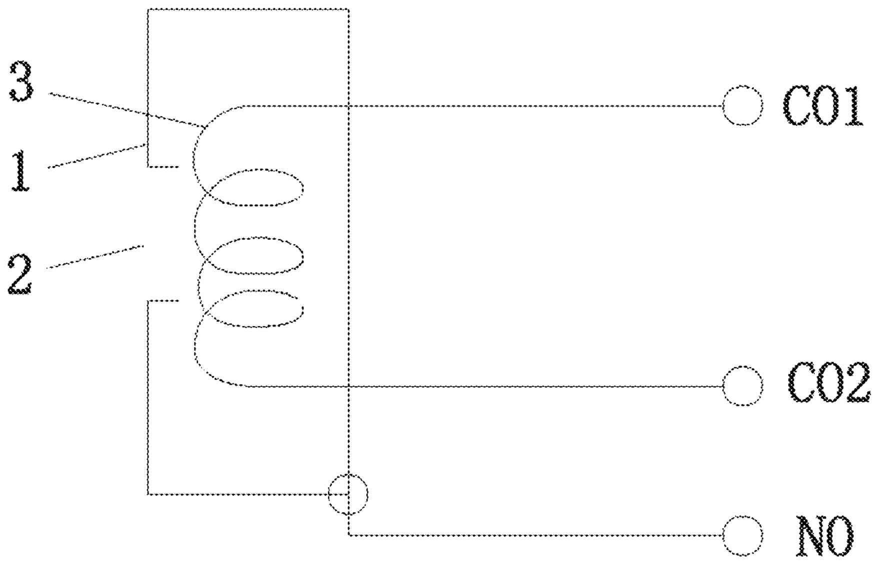
FIG. 3 is a schematic circuit diagram of the non-contact alternating current sensing probe in Embodiment 1 of the present invention.

Embodiment 1: Referring to FIG. 1, FIG. 2, and FIG. 3, a non-contact alternating current sensing probe 10 provided in this embodiment comprises a metal shielding shell 1 and an induction coil 2, wherein the metal shielding shell 1 is used for constructing a sealed shielding space for preventing electromagnetic interference; the metal shielding shell 1 is provided with a detection port 3 that can allow an electromagnetic signal in a specific direction to enter the shielding space; and a position of the induction coil 3 is not limited, the induction coil 2 is arranged in the metal shielding shell 1, facing the position of the detection port 3, and is used for detecting the electromagnetic signal that enters the metal shielding shell 1 from the detection port 3. The two ends of the induction coil 2 form terminals CO1 and CO2, and the metal shielding shell 1 is provided with a terminal NO. In this embodiment, the metal shielding shell 1 is a cubic shell body, and in other embodiments, the metal shielding shell 1 may also be in a cylindrical shape or other shapes.

A sensing method of the non-contact alternating current sensing probe 10 is as follows: During sensing, a sealed shielding space for preventing electromagnetic interference is constructed through the metal shielding shell 1, and because the metal shielding shell 1 is provided with the detection port 3, the electromagnetic signal in a specific direction can be allowed to enter the detection port 3 in the shielding space, and electromagnetic signals in other directions are shielded. The width of the detection port 3 is preferably 2 mm, and the length is preferably 2-5 mm. The induction coil 2 is fixed in the metal shielding shell 1.

Figure 4:
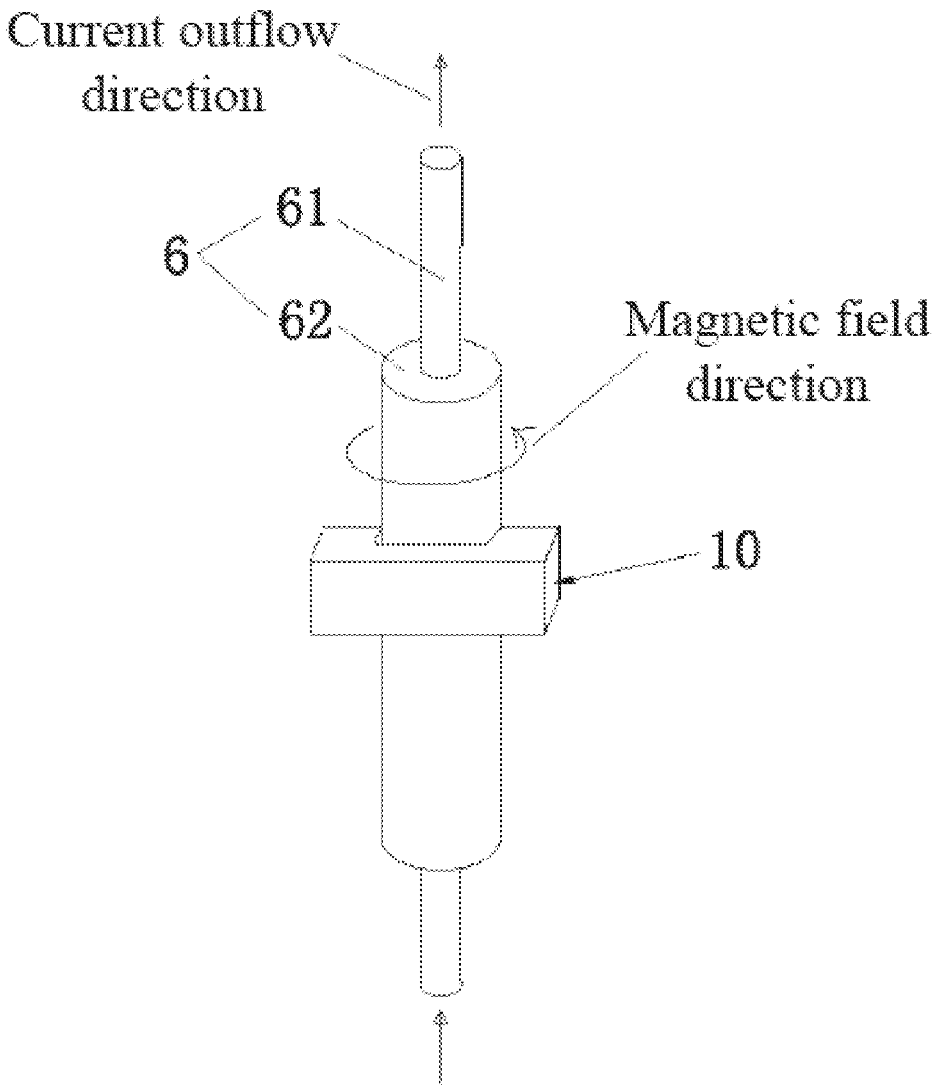
FIG. 4 is a structural schematic diagram 1 of sensing a single wire by the probe in Embodiment 1 of the present invention.
Figure 5:
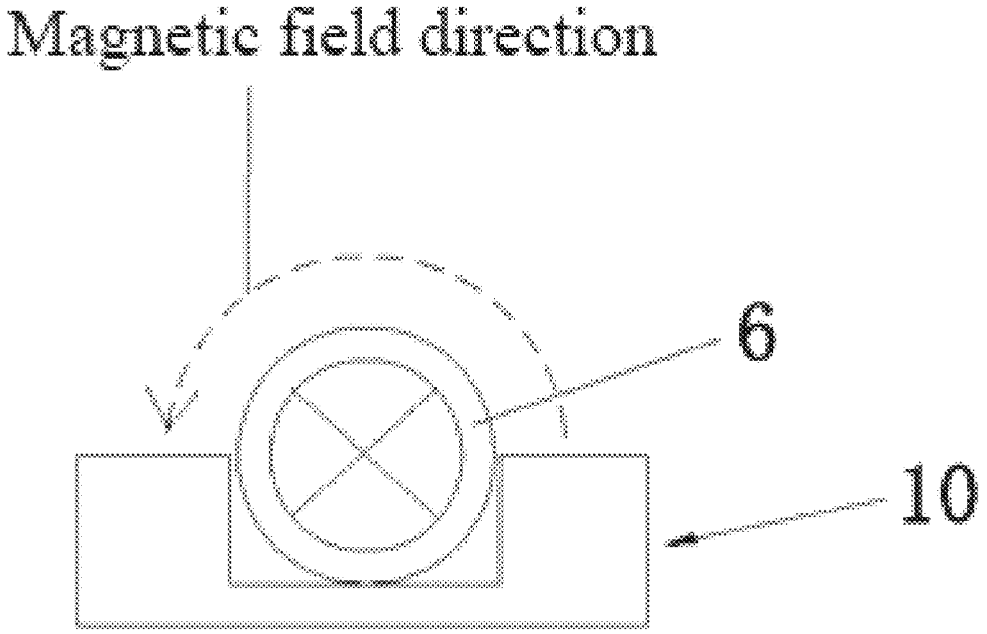
FIG. 5 is a structural schematic diagram 2 of sensing the single wire by the probe in Embodiment 1 of the present invention.
Figure 6:
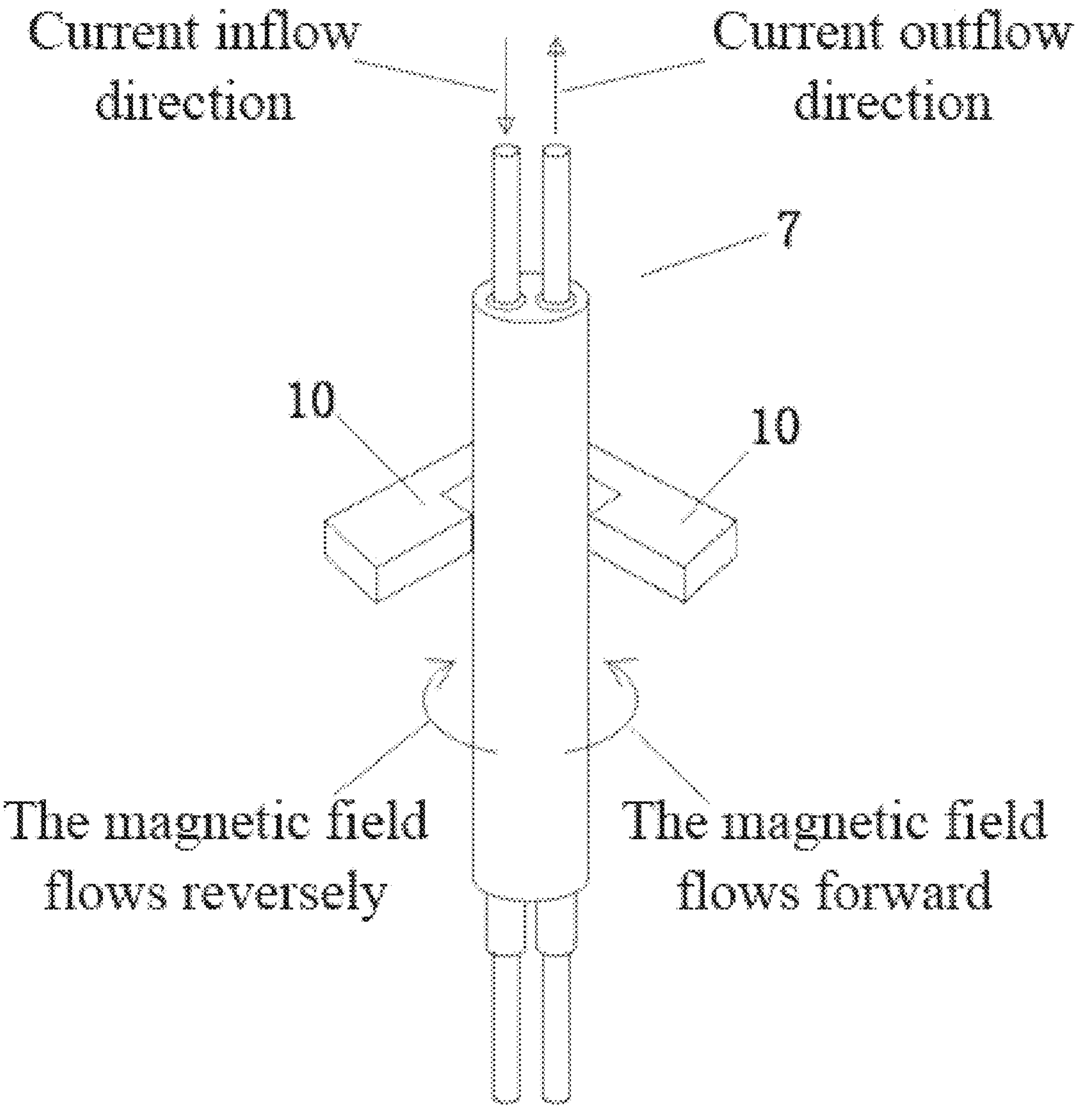
FIG. 6 is a structural schematic diagram 1 of sensing a non-twisted cable by the probe in Embodiment 1 of the present invention.
Figure 7:
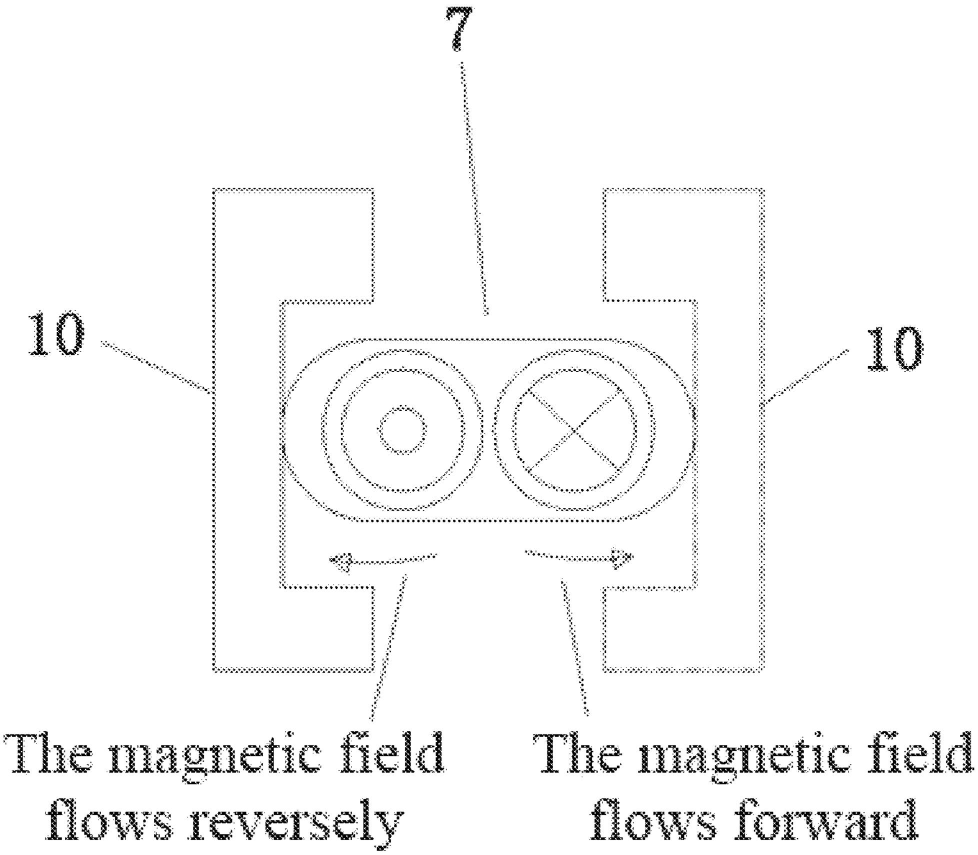
FIG. 7 is a structural schematic diagram 2 of sensing the non-twisted cable by the probe in Embodiment 1 of the present invention.
Figure 8:
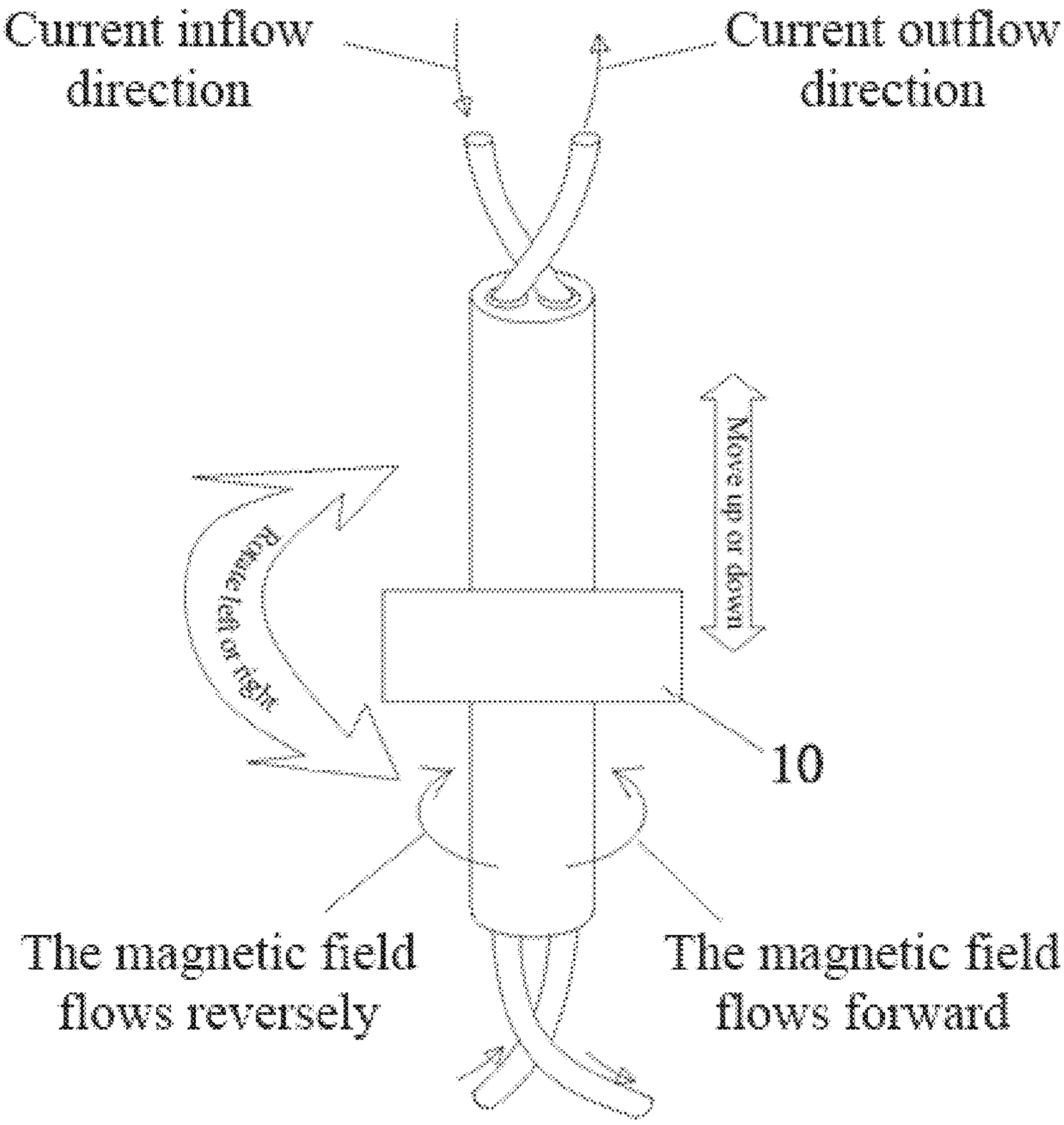
FIG. 8 is a structural schematic diagram 1 of sensing a twisted cable by the probe in Embodiment 1 of the present invention.
Figure 9:
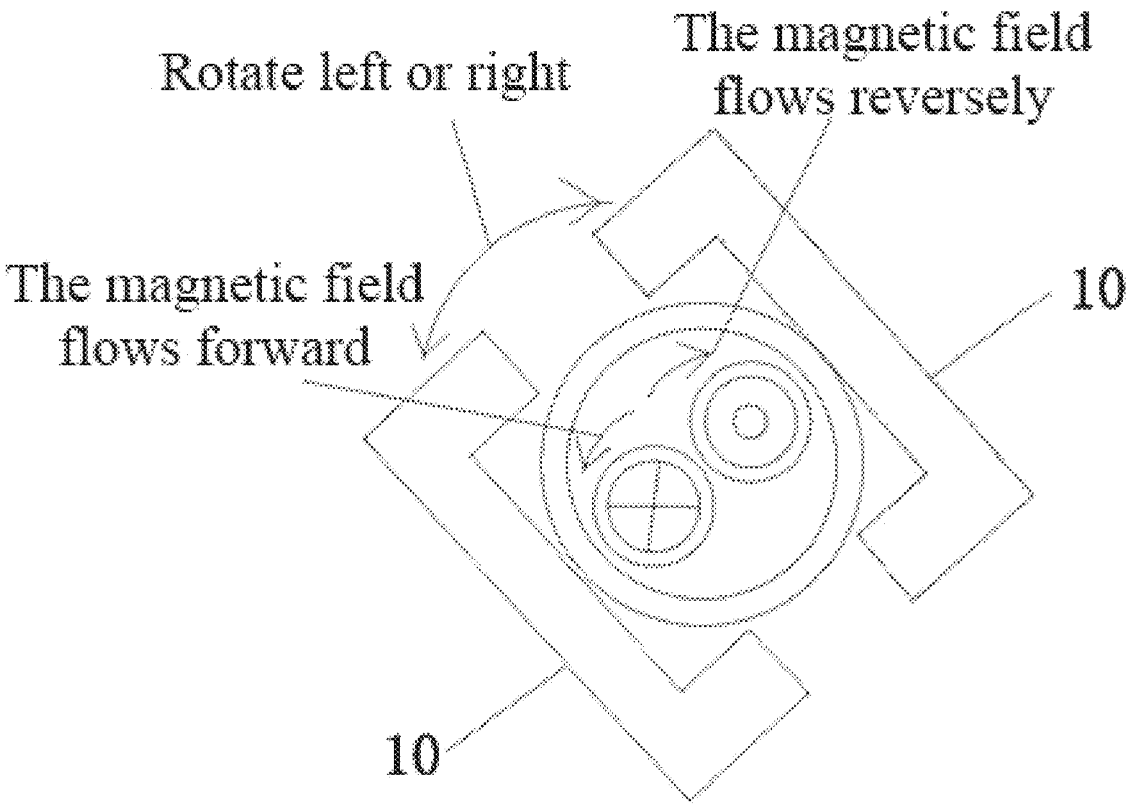
FIG. 9 is a structural schematic diagram 2 of sensing the twisted cable by the probe in Embodiment 1 of the present invention.

During sensing of a single wire 6, referring to FIG. 4 and FIG. 5, the single wire 6 comprises a wire core 61 and an insulation protective layer 62 covering the wire core 61. The detection port 3 is brought close to but not in contact with the single wire, so that an electromagnetic signal generated when an alternating current flows in the single wire 6 passes through the detection port 3 and enters the shielding space to be collected by the induction coil 2, and the induction coil 2 outputs a corresponding current signal;

during sensing of a non-twisted cable 7 formed by two wires arranged in parallel, referring to FIG. 6 and FIG. 7, the detection port 3 is brought close to but not in contact with the non-twisted cable 7, and then rotated around the non-twisted cable 7, so that the detection port 3 faces the wires in the non-twisted cable 7 one by one, that is, when the detection port 3 is flush with the two wires, and the detection port 3 faces the left wire or the right wire, an electromagnetic signal generated when an alternating current flows in the left target wire or the right target wire can be allowed to pass through the detection port 3 and enter the shielding space to be collected by the induction coil 2, and the induction coil 2 outputs a corresponding current signal; and during sensing of a twisted cable 8 formed by two wires twisted together, referring to FIG. 8 and FIG. 9, the detection port 3 is brought close to but not in contact with the twisted cable 8, and then rotated left or right (clockwise or counterclockwise) around the twisted cable 8 or moved up or down, and when the detection port is rotated to a corresponding angle or moved to a corresponding position so that the detection port 3 is roughly flush with the two wires, an electromagnetic signal generated when an alternating current flows in a target wire at a position of one side close to the detection port 3 can be allowed to pass through the detection port 3 and enter the shielding space to be collected by the induction coil 2, and the induction coil 2 outputs a corresponding current signal.

Figure 10:
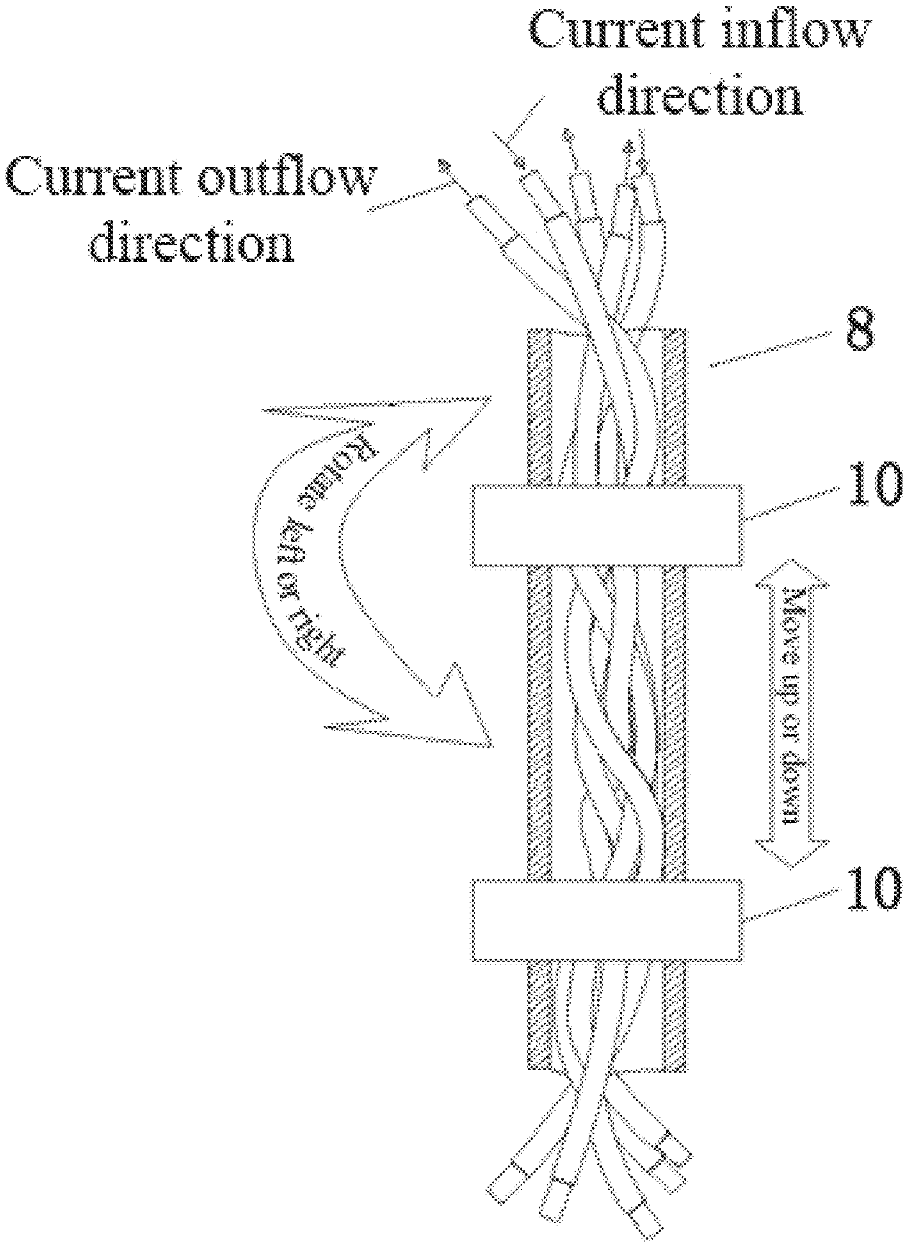
FIG. 10 is a structural schematic diagram 1 of sensing another twisted cable by the probe in Embodiment 1 of the present invention.
Figure 11:
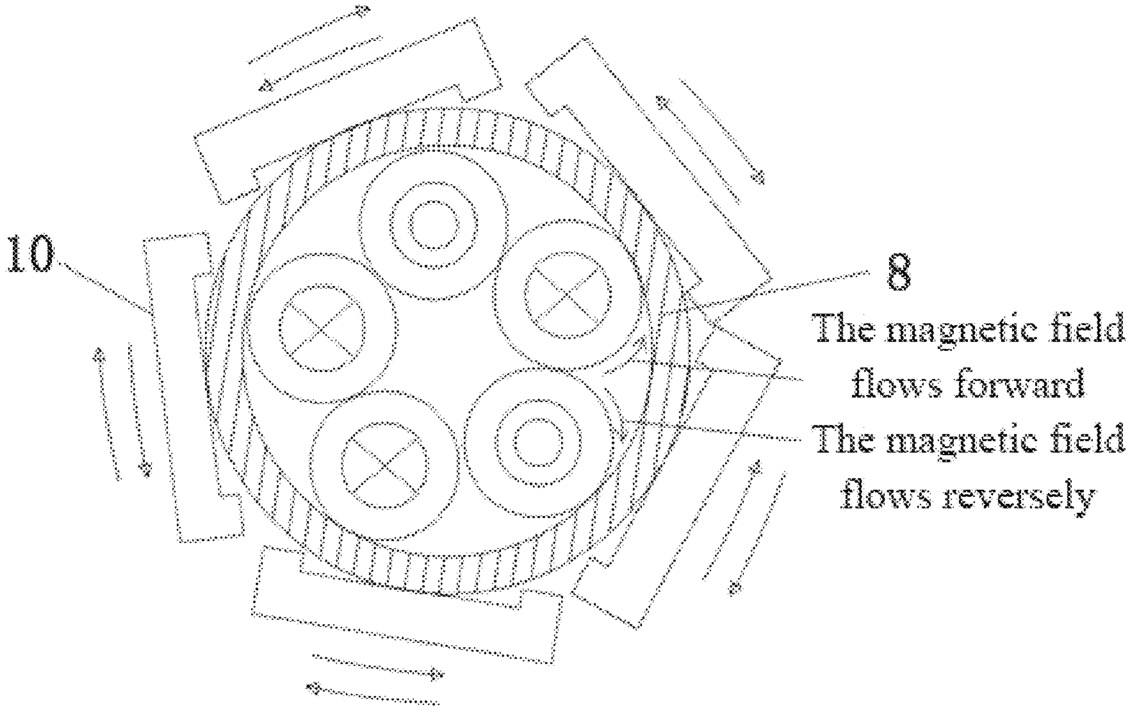
FIG. 11 is a structural schematic diagram 2 of sensing another twisted cable by the probe in Embodiment 1 of the present invention.

During sensing of a twisted cable formed by more than five wires twisted together, referring to FIG. 10 and FIG. 11, the detection port 3 is brought close to but not in contact with the twisted cable, and then rotated left or right around the twisted cable and moved up or down along the central axial direction of the twisted cable at the same time, so that the detection port 3 can find a better measurement position facing a target wire during the movement adjustment process, because when the detection port faces the target wire, a sensing value will increase to the highest value, and an electromagnetic signal generated when an alternating current flows in the target wire in the twisted cable can be allowed to pass through the detection port 3 and enter the shielding space to be collected by the induction coil 2, and the induction coil 2 outputs a corresponding current signal.

Figure 12:
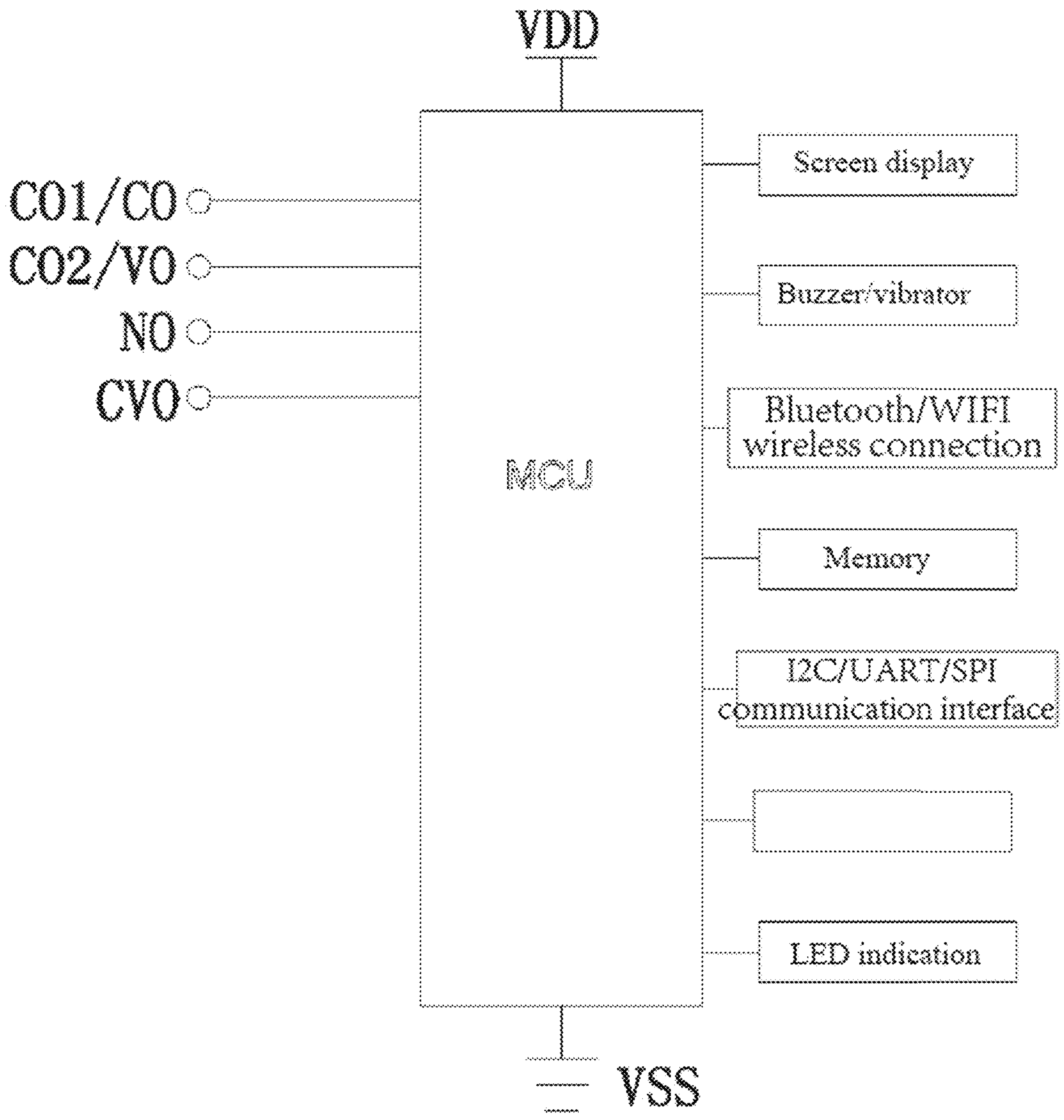
FIG. 12 is a schematic diagram of a connection port of a main control MCU chip in Embodiment 1 of the present invention.

Referring to FIG. 12, an MCU chip of a model of STM8L151 or ML54/56 series may be chosen as the main control MCU chip, and a signal amplification circuit and a noise filter circuit are preferably equipped, to realize signal amplification and noise filtering on the current signal output by the induction coil 2.

The main control MCU chip is connected to the non-contact alternating current sensing probe 10 through the terminal CO1, the terminal CO2, and the terminal NO. Through analytic operation processing of the main control MCU chip, related electrical parameters are obtained, such as a current, a voltage, a frequency, a duty cycle, a phase, a harmonic, and a frequency-conversion signal.

Current: When a current flows in a wire, a corresponding magnetic field will be generated, this magnetic field can be captured and collected by the induction coil 2, an intensity of the current is detected according to the electromagnetic induction principle, and then a value of the current is measured.

Voltage: An electromagnetic field change can be detected according to the electromagnetic induction principle, so as to obtain voltage information, and measure a value of the voltage.

Frequency: In an alternating current circuit, periodic changes in the current and voltage correspond to specific frequencies, and through analyzing a period and a frequency of an electromagnetic signal, a transmission frequency of a wire can be determined.

Duty cycle: A Duty cycle refers to a proportional relationship between high level duration and a period in a periodic signal. Through detecting changes in a pulse width or signal intensity of an electromagnetic signal, a duty cycle of the signal can be analyzed and measured.

Phase: A phase in an electromagnetic signal can be measured based on a time difference between the starting point of a detected signal and the starting point of a reference signal. This is to describe an offset relationship of a periodic signal in timeline based on the phase, and a transmission speed and time delay of an electromagnetic wave is used to determine phase information.

Harmonic: Through analyzing a spectrum of an electromagnetic signal, a harmonic component in a wire can be detected. A harmonic refers to a periodic signal component whose frequency is an integer multiple of a fundamental frequency. A nonlinear load will cause distortion of a current or voltage, then the harmonic is generated, and through detecting and analyzing the spectrum of the electromagnetic signal, the existence and value of the harmonic component can be determined.

Frequency-conversion signal: The induction coil 2 is used to induce a magnetic field change generated from a current in a wire, to detect the frequency-conversion signal.

Figure 13:
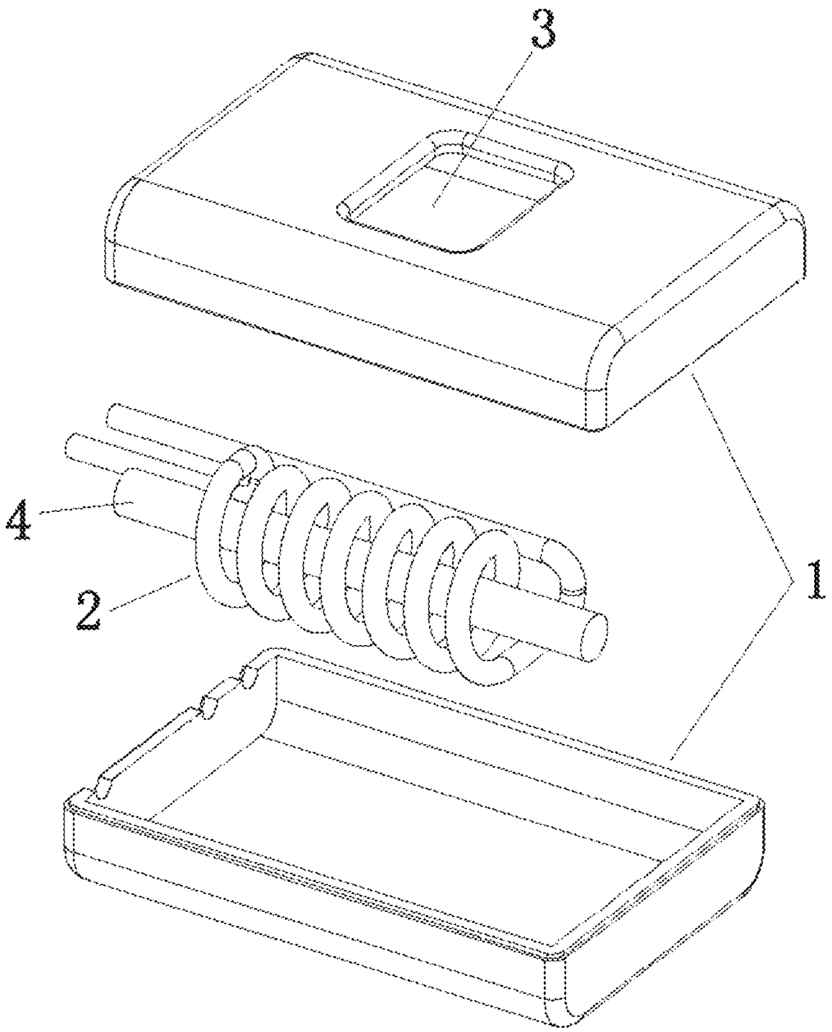
FIG. 13 is an exploded structural schematic diagram of the non-contact alternating current sensing probe in Embodiment 2 of the present invention.
Figure 14:
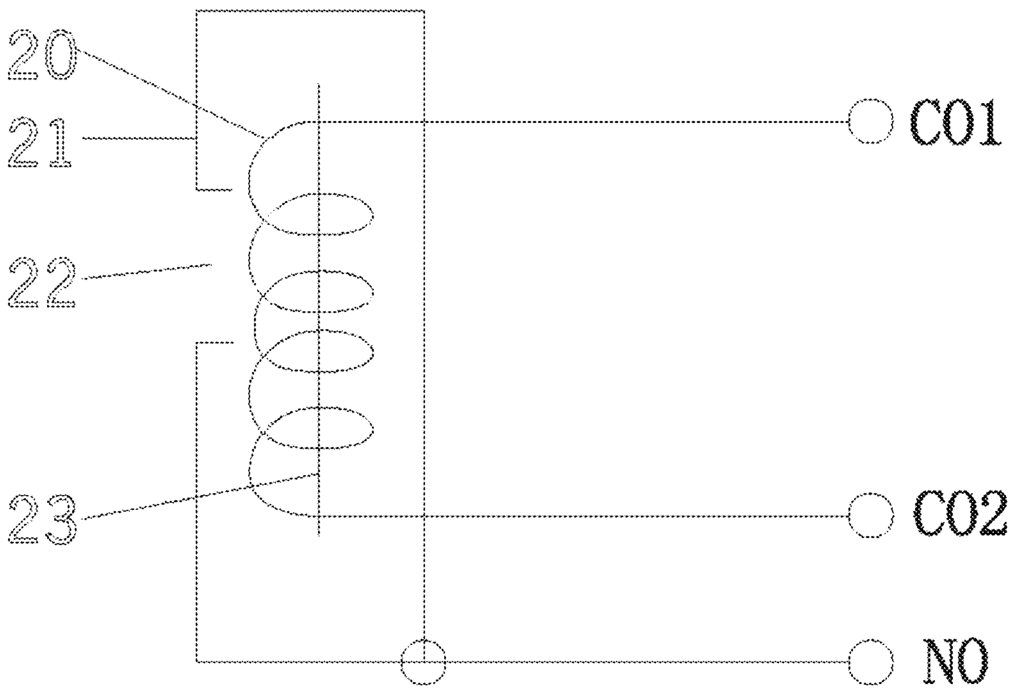
FIG. 14 is a schematic circuit diagram of the non-contact alternating current sensing probe in Embodiment 2 of the present invention.

Embodiment 2: Referring to FIG. 13 and FIG. 14, a non-contact alternating current sensing probe provided in this embodiment has a structure basically the same as that of Embodiment 1, and a difference lies in that the induction coil 2 is a hollow induction coil with an iron rod 4 penetrating through the middle. The iron rod 4 can enhance sensitivity of the induction coil 2 to a magnetic field change, so that detection effect is improved, making it more sensitive and accurate.

Figure 15:
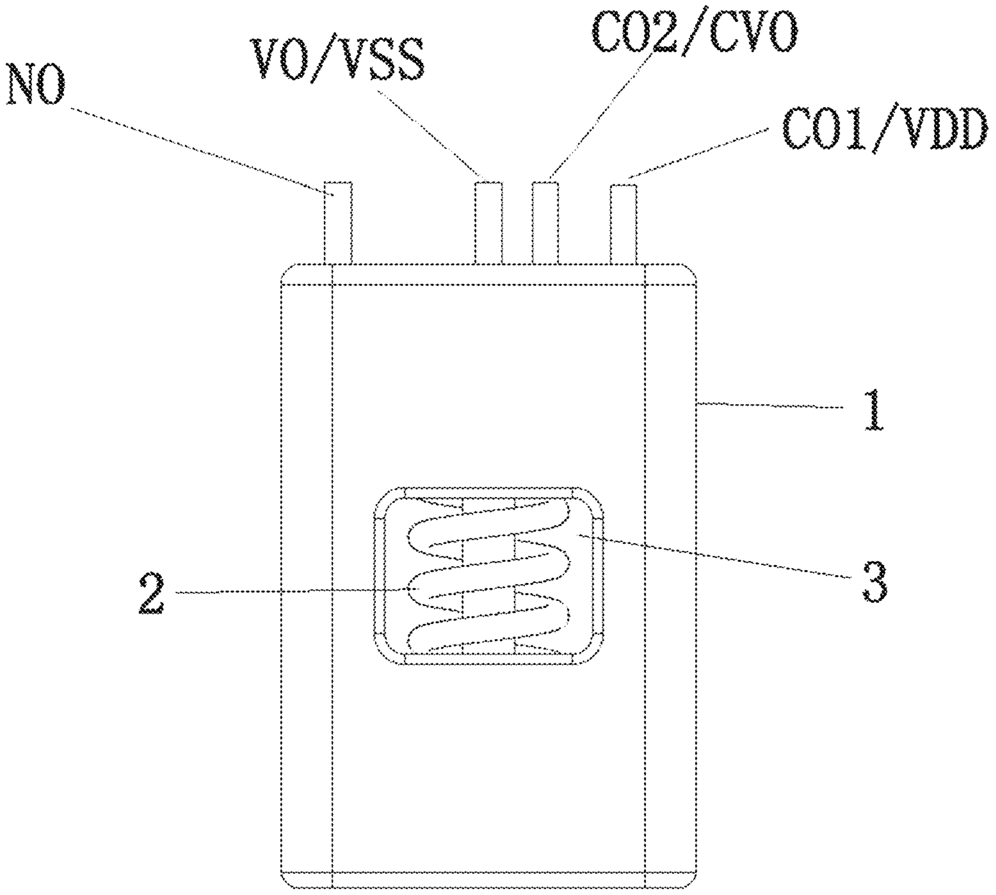
FIG. 15 is a front structural schematic view of the non-contact alternating current sensing probe in Embodiment 3 of the present invention.
Figure 16:
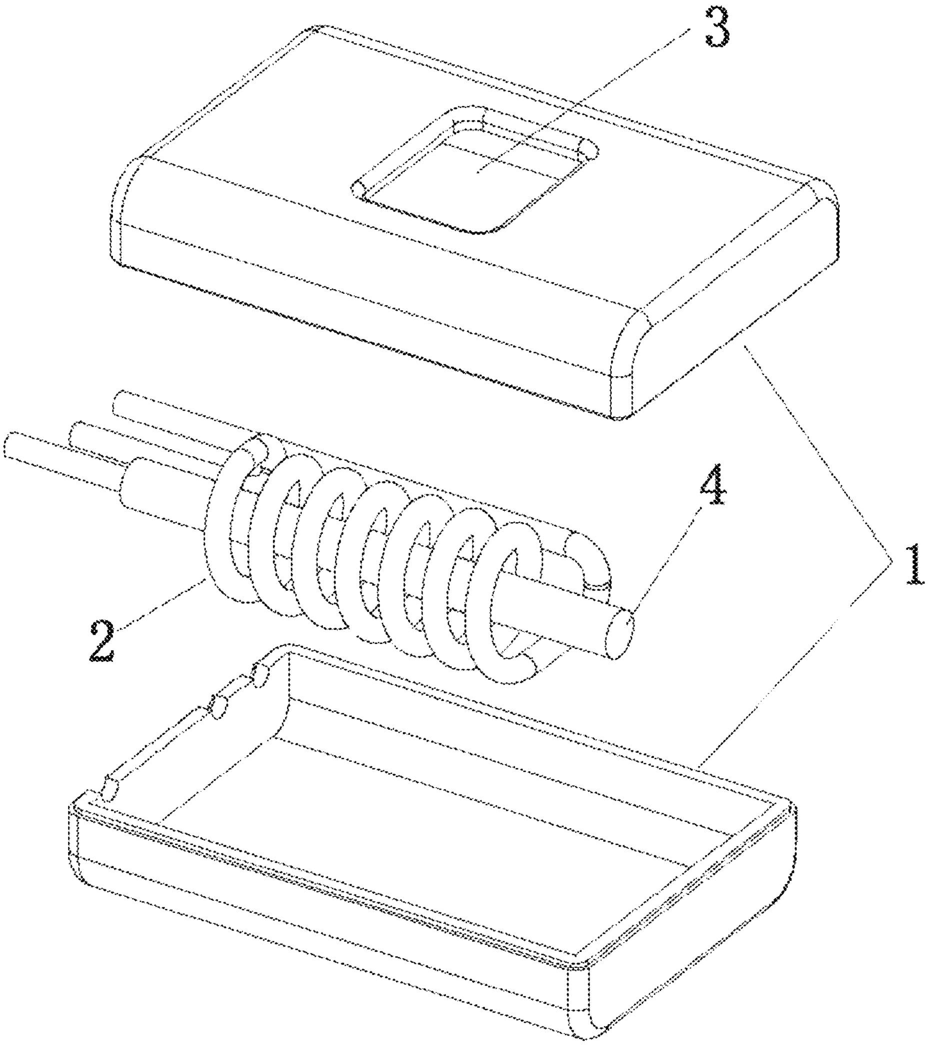
FIG. 16 is an exploded structural schematic diagram of the non-contact alternating current sensing probe in Embodiment 3 of the present invention.
Figure 17:
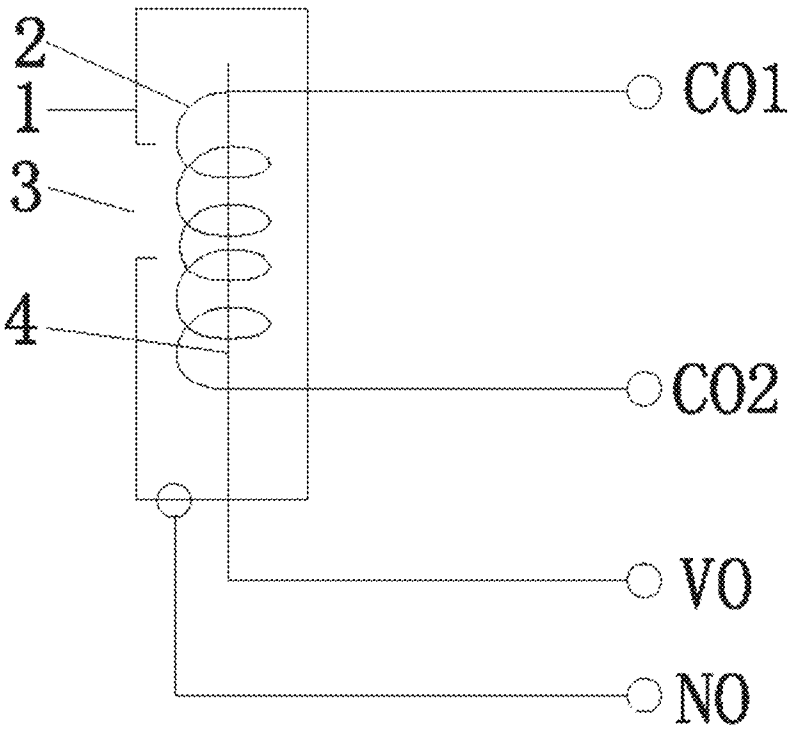
FIG. 17 is a schematic circuit diagram of the non-contact alternating current sensing probe in Embodiment 3 of the present invention.

Embodiment 3: Referring to FIG. 15, FIG. 16, and FIG. 17, a non-contact alternating current sensing probe provided in this embodiment has a structure basically the same as that of Embodiment 2, and a difference lies in that the iron rod 4 is provided with a terminal VO extending out of the metal shielding shell 1, which is used for inducing a current, a voltage, a frequency, a duty cycle, a phase, a harmonic, a frequency-conversion signal, etc., to improve detection precision.

Figure 18:
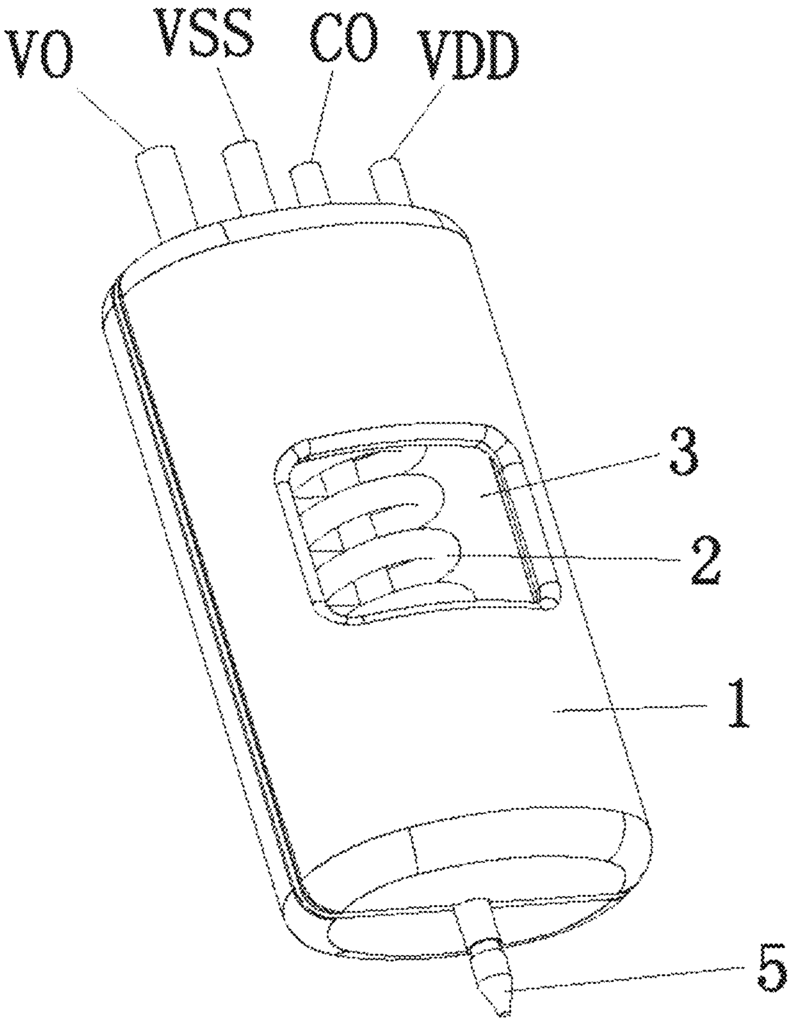
FIG. 18 is a three-dimensional structural schematic diagram of a non-contact alternating current sensing probe in Embodiment 4 of the present invention.
Figure 19:
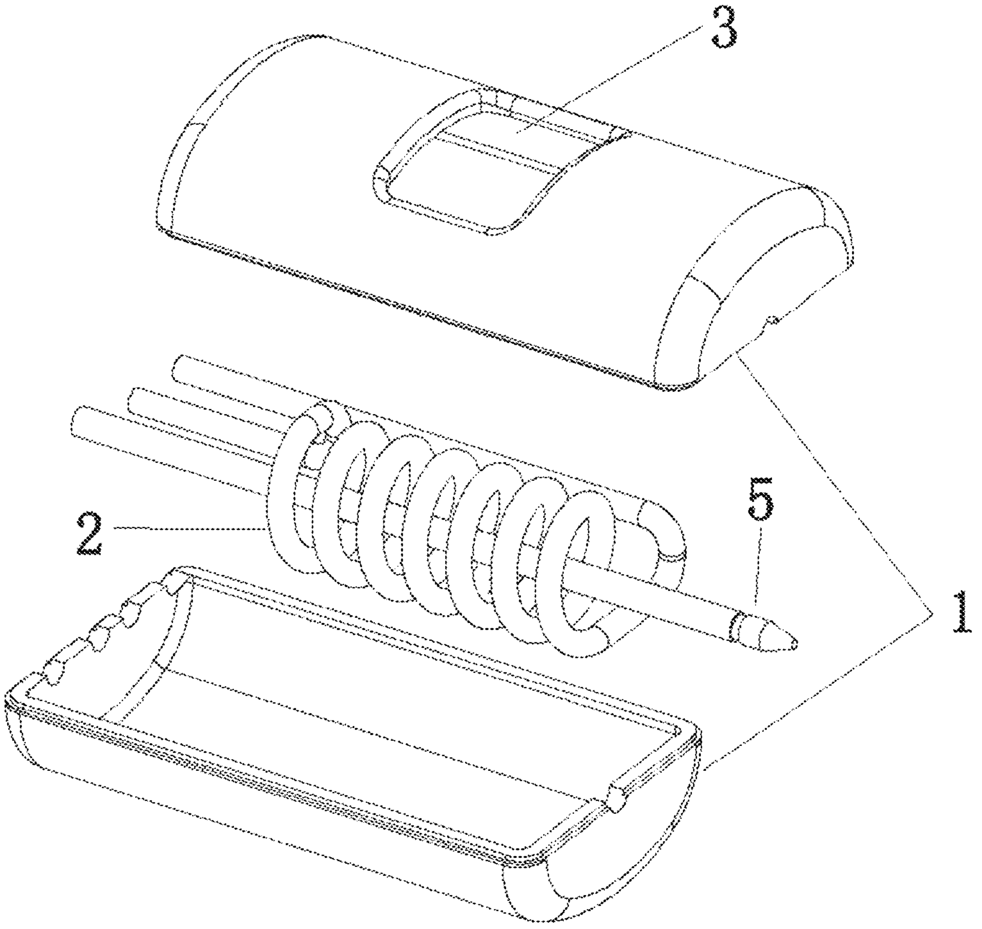
FIG. 19 is an exploded structural schematic diagram of the non-contact alternating current sensing probe in Embodiment 4 of the present invention.
Figure 20:
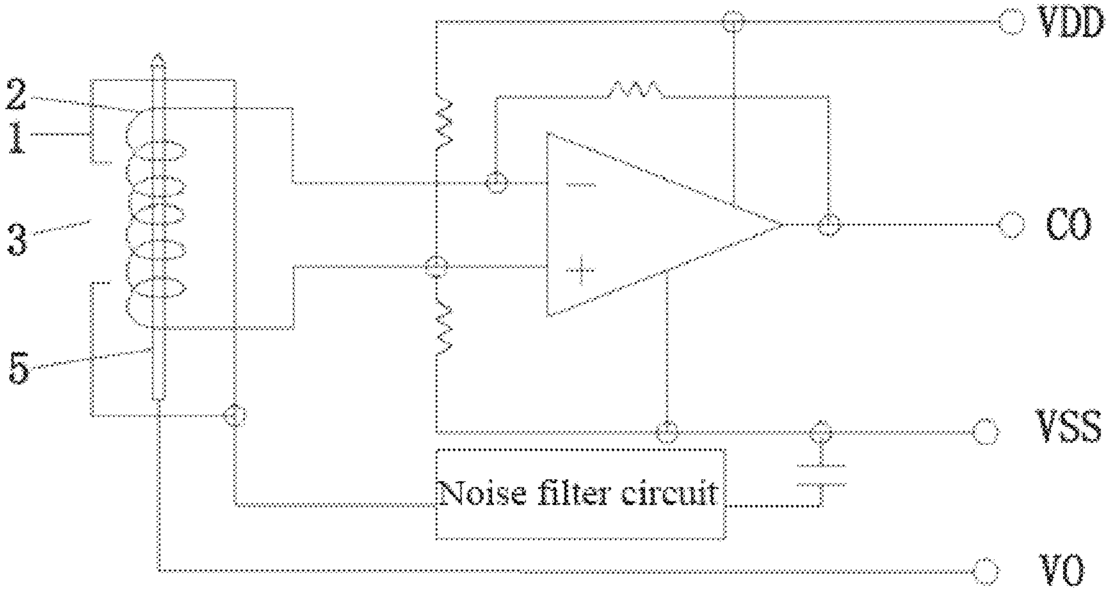
FIG. 20 is a schematic circuit diagram of the non-contact alternating current sensing probe in Embodiment 4 of the present invention.

Embodiment 4: Referring to FIG. 18, FIG. 19 and FIG. 20, a non-contact alternating current sensing probe provided in this embodiment has a structure basically the same as that of Embodiment 3, and a difference lies in that a feeler pin 5 of a test pen is adopted to replace the iron rod 4, and a terminal VO is provided. For example, the test pen may be a test pen of a multimeter, further improving functions of the multimeter. The metal shielding shell 1 is connected to a noise filter circuit, so that unnecessary noise can be filtered. The induction coil 2 is connected to a signal amplification circuit, and the signal amplification circuit amplifies the current signal induced by the induction coil 2 and inputs an amplified current signal to a main control MCU chip for analytic operation processing.

Figure 21:
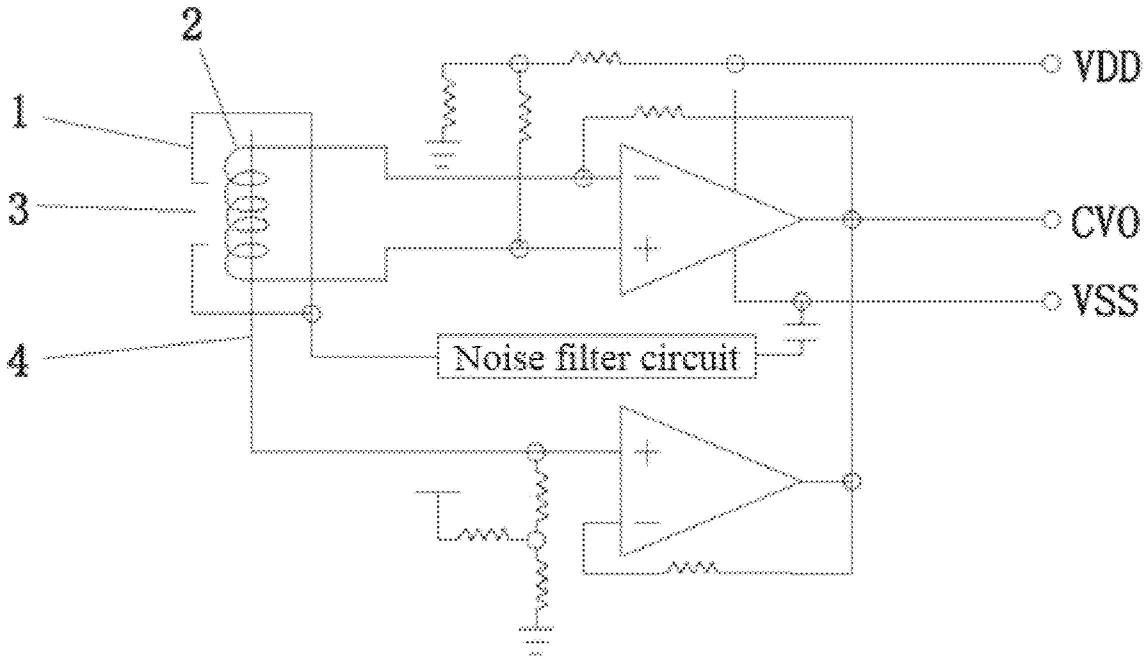
FIG. 21 is a schematic circuit diagram of the non-contact alternating current sensing probe in Embodiment 5 of the present invention.

Embodiment 5: Referring to FIG. 21, a non-contact alternating current sensing probe provided in this embodiment has a structure basically the same as that of Embodiment 3, and a difference lies in that the metal shielding shell 1 is connected to a noise filter circuit, so that unnecessary noise can be filtered. The induction coil 2 is connected to a signal amplification circuit, and the signal amplification circuit amplifies the current signal induced by the induction coil 2 and inputs an amplified current signal to a main control MCU chip for analytic operation processing. The iron rod 4 is connected to another signal amplification circuit, so that the capacity to sense a magnetic field change can be further enhanced, precision and reliability of detection can be improved, and the probe can adapt to more complex application scenarios.

The non-contact alternating current sensing probe can be applied to a test pen or a measuring instrument. For details, refer to the following application examples.

Figure 22:
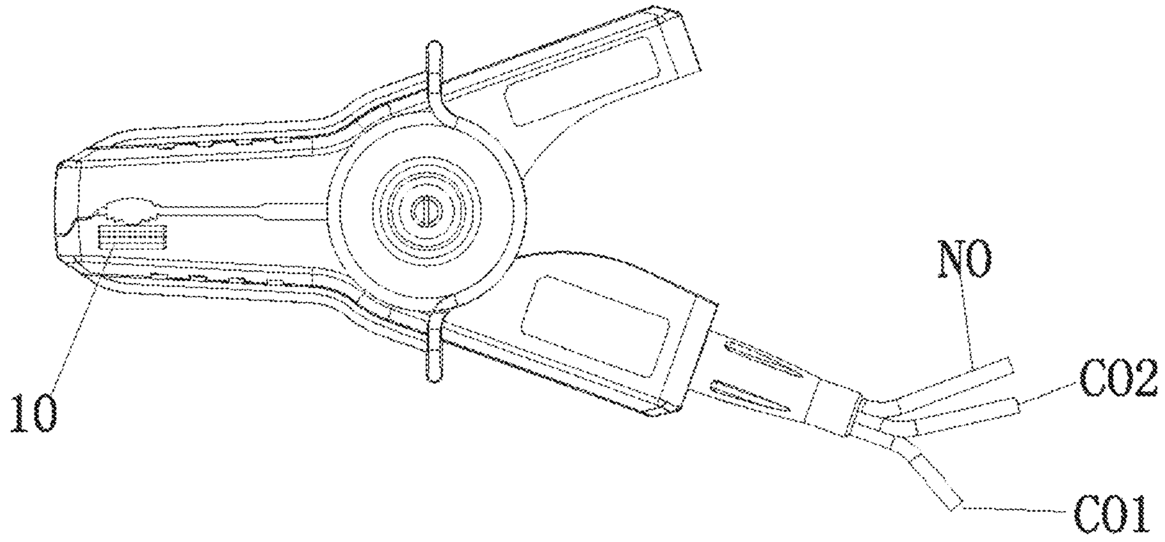
FIG. 22 is a structural schematic diagram of a product of Application example 1 of the present invention.

Application example 1: Referring to FIG. 22, the non-contact alternating current sensing probe 10 provided in Embodiment 1 can be applied to a multi-functional induction clamp head, and the non-contact alternating current sensing probe 10 is located at the inner side of an arc recess of a clamping opening of the multi-functional induction clamp head.

Figure 23:
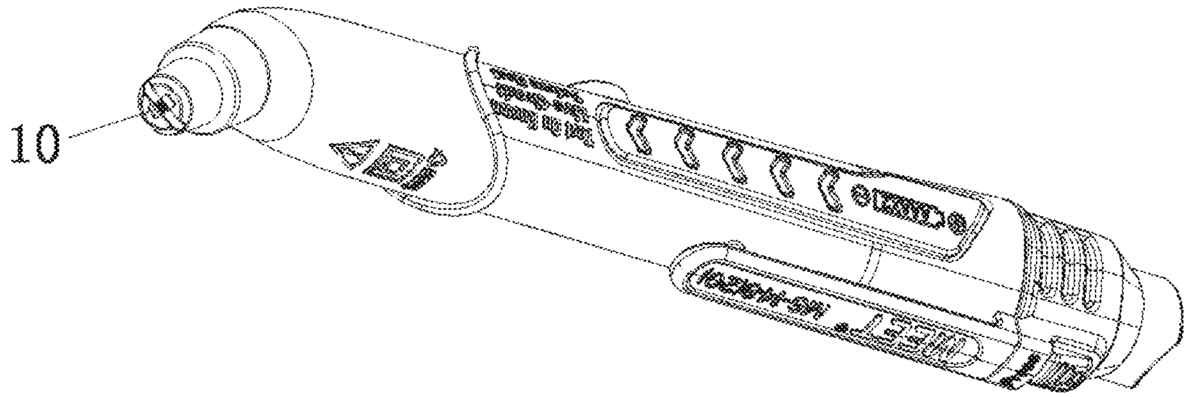
FIG. 23 is a structural schematic diagram of a product of Application example 2 of the present invention.

Application example 2: Referring to FIG. 23, the non-contact alternating current sensing probe 10 provided in Embodiment 1 or 2 can be applied to a dual-sensing ammeter, and the non-contact alternating current sensing probe 10 is located at the inner side of an arc recess of a detection head of the dual-sensing ammeter.

Figure 24:
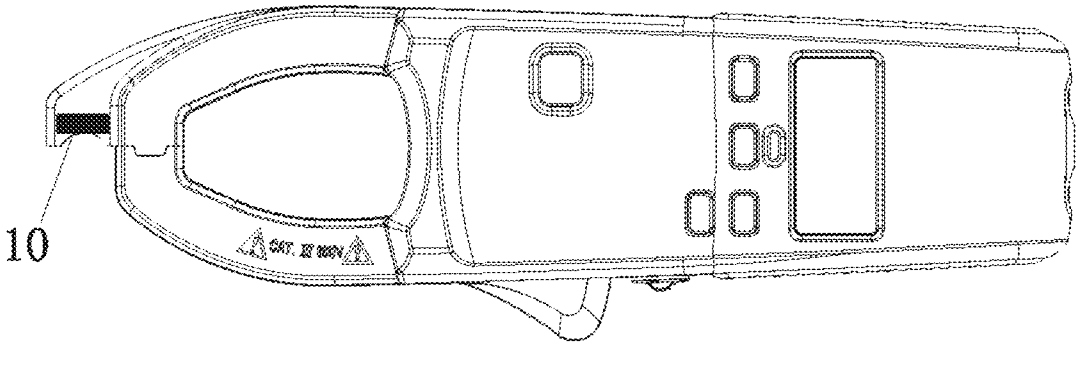
FIG. 24 is a structural schematic diagram of a product of Application example 3 of the present invention.

Application example 3: Referring to FIG. 24, the non-contact alternating current sensing probe 10 provided in Embodiment 2 can be applied to a non-contact clamp meter, a protrusion portion is arranged at a position of a jaw of the non-contact clamp meter, and the non-contact alternating current sensing probe 10 is located in the protrusion portion. During detection, the protrusion portion is just brought close to a wire and cable to be detected.

Figure 25:
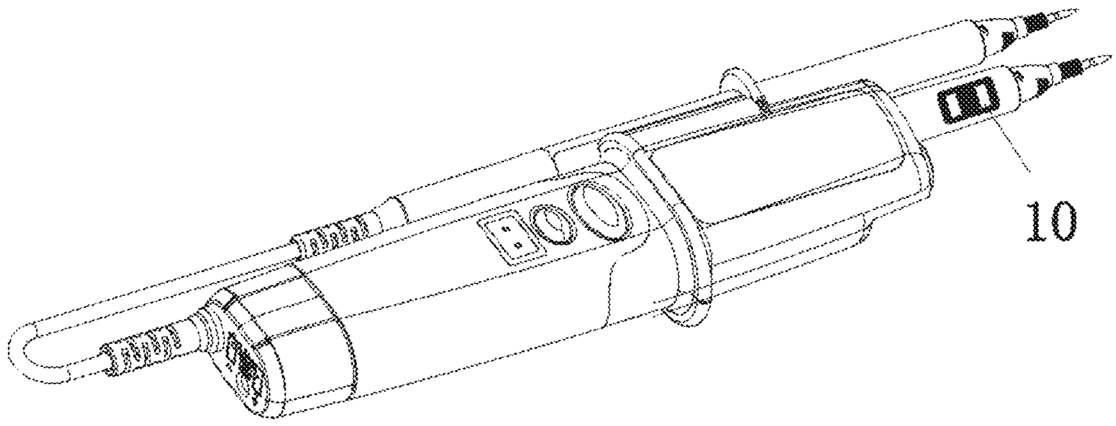
FIG. 25 is a structural schematic diagram of a product of Application example 4 of the present invention.

Application example 4: Referring to FIG. 25, the non-contact alternating current sensing probe 10 provided in Embodiment 3 can be applied to an electrical tester, the electrical tester has a fixed gauge pen, and the non-contact alternating current sensing probe 10 is located at the inner side of a pen body of the fixed gauge pen. During detection, the pen body of the fixed gauge pen is just brought close to a wire and cable to be detected.

Figure 26:
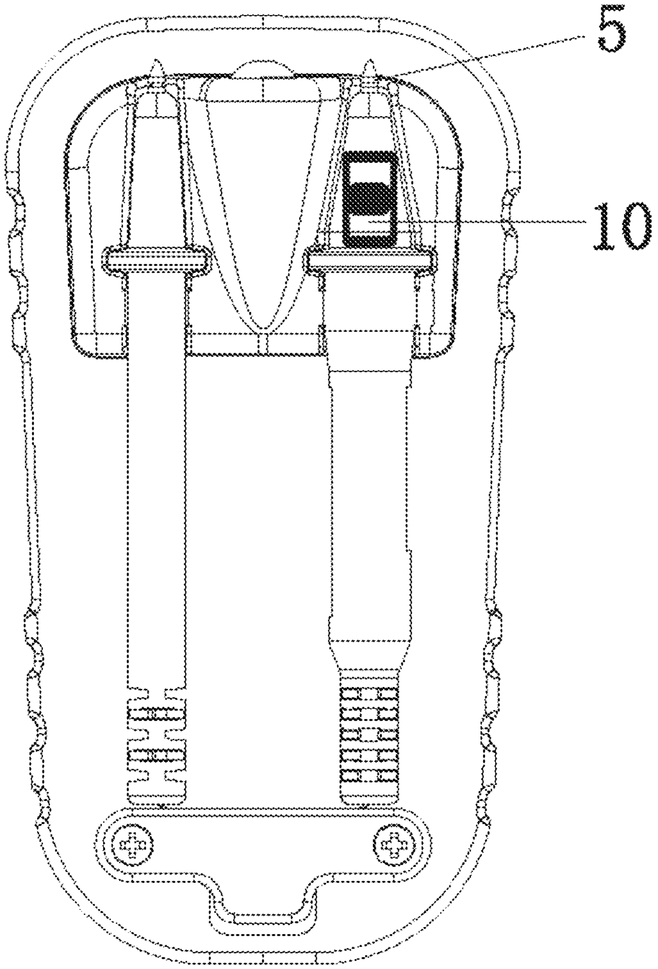
FIG. 26 is a structural schematic diagram of a product of Application example 5 of the present invention.

Application example 5: Referring to FIG. 26, the non-contact alternating current sensing probe 10 provided in Embodiment 4 can be applied to a head position of a test pen of a multimeter, and during detection, the head of the test pen is just brought close to a wire and cable to be detected.

Figure 27:
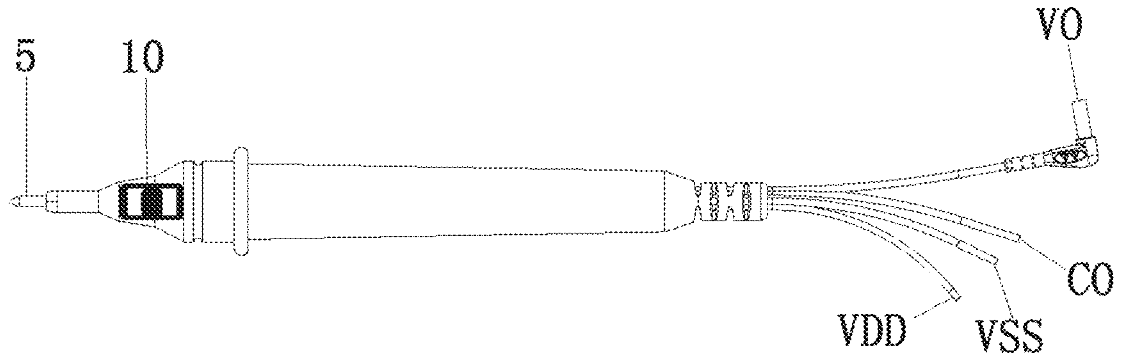
FIG. 27 is a structural schematic diagram of a product of Application example 6 of the present invention.

Application example 6: Referring to FIG. 27, the non-contact alternating current sensing probe 10 provided in Embodiment 4 can be applied to a head position of a multi-functional lead, and during detection, the head of the multi-functional lead is just brought close to a wire and cable to be detected.

Figure 28:
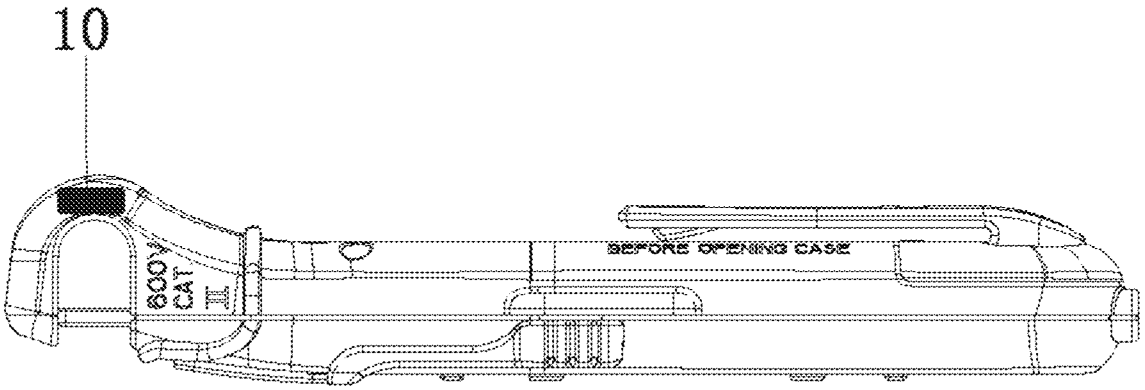
FIG. 28 is a structural schematic diagram of a product of Application example 7 of the present invention.

Application example 7: Referring to FIG. 28, the non-contact alternating current sensing probe 10 provided in Embodiment 5 can be applied to a head detection position of a pen-type meter, and during detection, a wire and cable to be detected are just placed into the head detection position of the pen-type meter.

Figure 29:
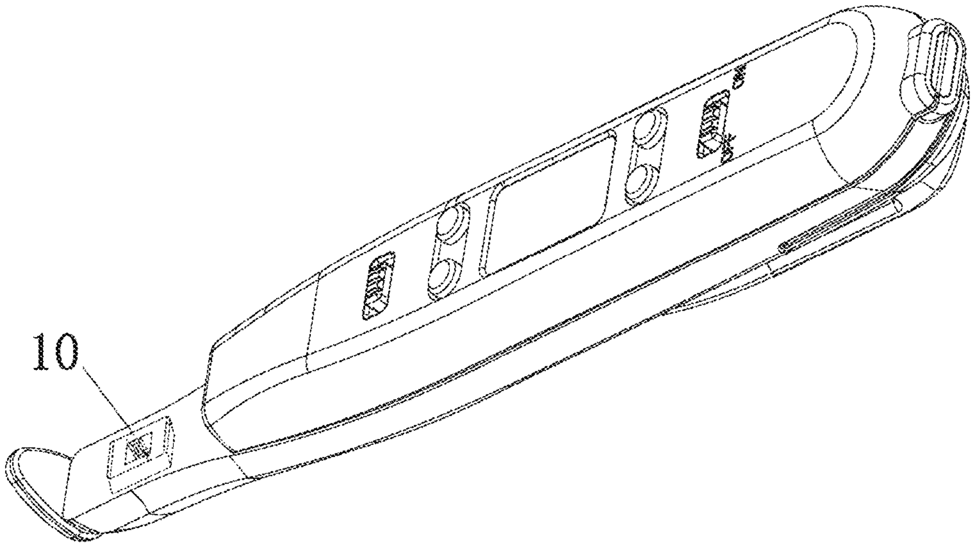
FIG. 29 is a structural schematic diagram of a product of Application example 8 of the present invention.

Application example 8: Referring to FIG. 29, the non-contact alternating current sensing probe 10 provided in Embodiment 5 can be applied to a head detection position of a multi-functional electricity meter, and during detection, a wire and cable to be detected are just placed into the head detection position of the multi-functional electricity meter.

The above embodiments and application examples are only preferred embodiments and application modes of the present invention, the present invention cannot list them one by one, and all technical solutions adopting one of the foregoing embodiments or application modes, or equivalent changes made according to the foregoing embodiments, are within the protection scope of the present invention.

The measuring instrument adopting the non-contact alternating current sensing probe 10 of the present invention can directly perform alternating current measurement on a single wire or a cable composed of two or more wires (except a shielded cable), to obtain electrical parameters such as a current, a voltage, a frequency, a duty cycle, a phase, a harmonic, and a frequency-conversion signal. Generally speaking, the present invention has the following advantages:

1. Alternating current measurement can be performed on a single wire or a cable including a plurality of wires (except a shielded wire), and in addition to sensing of a current, an alternating voltage, a frequency, a duty cycle, a phase, a harmonic, a frequency-conversion signal, etc. can also be sensed.
2. In addition to simultaneous measurement of a single-phase alternating current and voltage, an electric power can be calculated and a result can be displayed through operation processing of the main control MCU chip.

3. An alternating voltage, a frequency, a duty cycle, a phase, a harmonic, and a frequency-conversion signal can be sensed on an alternating current three-phase four-wire cable (except a shielded cable) and a result of measurement data can be displayed.
4. A traditional silicon steel sheet structure is omitted, and the non-contact alternating current sensing probe can work for a long time, and cannot lead to the problem of inaccuracy caused by heat.
5. The main control MCU chip can use wireless connection manners such as Bluetooth and Wi-Fi to share data mutually with smartphones, tablets, and computers, and operations are simple and convenient.

Based on the disclosure and teachings of the foregoing specification, those skilled in the art to which the present invention belongs can also make changes and modifications to the foregoing implementation manners. Therefore, the present invention is not limited to the specific implementation manners disclosed and described above, and some modifications and changes made to the present invention shall also fall within the protection scope of the claims of the present invention. In addition, although some specific terms are used in this specification, these terms are only for convenience of explanation and do not constitute any limitation on the present invention. As described in the foregoing embodiments of the present invention, other structures and methods obtained by using the same or similar steps thereof are within the protection scope of the present invention.

What is claimed is:

1. A non-contact alternating current sensing method, comprising the following steps:

constructing a sealed shielding space on a non-contact alternating current sensing probe for preventing electromagnetic interference, arranging a detection port on the non-contact alternating current sensing probe, the detection port being configured to allow an electromagnetic signal in a specific direction to enter the shielding space, and arranging, in the shielding space, an induction coil that can collect the electromagnetic signal passing through the detection port to enter the shielding space;

during sensing of a single wire, moving the detection port to be close to but not in contact with the single wire, so that an electromagnetic signal generated when an alternating current flows in the single wire is able to pass through the detection port to enter the shielding space to be collected by the induction coil, and the induction coil outputs a corresponding current signal;

during sensing of a non-twisted cable formed by two or more wires arranged in parallel, moving the detection port to be close to but not in contact with the non-twisted cable, and rotating around the non-twisted cable, so that the detection port faces the wires in the non-twisted cable one by one, and an electromagnetic signal generated when an alternating current flows in a target wire in the non-twisted cable is able to pass through the detection port to enter the shielding space to be collected by the induction coil, and the induction coil outputs a corresponding current signal; and during sensing of a twisted cable formed by two or more wires twisted together, moving the detection port to be close to but not in contact with the twisted cable, and then rotating around the twisted cable and/or moving along a direction of a central axis of the twisted cable, so that an electromagnetic signal generated when an alternating current flows in a target wire in the twisted cable is able to pass through the detection port to enter the shielding space to be collected by the induction coil, and the induction coil outputs a corresponding current signal.

2. The non-contact alternating current sensing method according to claim 1, wherein the current signal output by the induction coil is subjected to signal amplification and noise filtering and then is subjected to analytic operation processing by a main control MCU chip, to obtain related electrical parameters.

3. The non-contact alternating current sensing method according to claim 2, wherein the electrical parameters comprise a current, a voltage, a frequency, a duty cycle, a phase, a harmonic, and a frequency-conversion signal.

4. A non-contact alternating current sensing probe for implementing the non-contact alternating current sensing method according to claim 1, comprising a metal shielding shell used for constructing a sealed shielding space for preventing electromagnetic interference; wherein the metal shielding shell is provided with a detection port that can allow an electromagnetic signal in a specific direction to enter the shielding space; and an induction coil, wherein the induction coil is arranged in the shielding space, and is used for sensing the electromagnetic signal that enters the metal shielding shell from the detection port and outputting a corresponding current signal.

5. The non-contact alternating current sensing probe according to claim 4, wherein the induction coil is a hollow induction coil, with an iron rod for enhancing sensitivity of the induction coil to a magnetic field change penetrating through the middle.

6. The non-contact alternating current sensing probe according to claim 4, wherein the induction coil is connected to a signal amplification circuit.

7. The non-contact alternating current sensing probe according to claim 5, wherein the iron rod is connected to another signal amplification circuit.

8. The non-contact alternating current sensing probe according to claim 5, wherein the metal shielding shell is connected to a noise filter circuit.

9. The non-contact alternating current sensing probe according to claim 4, applied to a test pen, wherein the induction coil is a hollow induction coil, and a feeler pin of the test pen penetrates through the induction coil.

10. The non-contact alternating current sensing probe according to claim 4, applied to a measuring instrument.

* * * * *